United States Patent
Lin et al.

(10) Patent No.: US 11,192,187 B2
(45) Date of Patent: Dec. 7, 2021

(54) ADDITIVE MANUFACTURING DEVICE UTILIZING EB-LASER COMPOSITE SCAN

(71) Applicant: Tsinghua University, Beijing (CN)

(72) Inventors: Feng Lin, Beijing (CN); Bin Zhou, Beijing (CN); Chao Guo, Beijing (CN); Wenjun Ge, Beijing (CN); Lei Zhang, Beijing (CN)

(73) Assignee: Tsinghua University, Beijing (CN)

( * ) Notice: Subject to any disclaimer, the term of this patent is extended or adjusted under 35 U.S.C. 154(b) by 1072 days.

(21) Appl. No.: 15/556,797

(22) PCT Filed: Mar. 9, 2016

(86) PCT No.: PCT/CN2016/075943
§ 371 (c)(1),
(2) Date: Dec. 1, 2017

(87) PCT Pub. No.: WO2016/141876
PCT Pub. Date: Sep. 15, 2016

(65) Prior Publication Data
US 2018/0079003 A1    Mar. 22, 2018

(30) Foreign Application Priority Data

Mar. 10, 2015 (CN) .......................... 201510104702.9

(51) Int. Cl.
*B22F 10/20* (2021.01)
*B29C 64/153* (2017.01)
(Continued)

(52) U.S. Cl.
CPC ............ *B22F 10/20* (2021.01); *B23K 15/002* (2013.01); *B23K 15/004* (2013.01);
(Continued)

(58) Field of Classification Search
CPC ..... B22F 3/1055; B33Y 30/00; B29C 64/153; B29C 64/371
See application file for complete search history.

(56) References Cited

U.S. PATENT DOCUMENTS 2,496,127 A * 1/1950 Kelar ................... H01J 29/845
                                                        315/15
5,306,447 A * 4/1994 Marcus ................. B29C 64/159
                                                        264/497
(Continued)

FOREIGN PATENT DOCUMENTS

CN        1426335 A       6/2003
CN     103849716 A        6/2014
(Continued)

OTHER PUBLICATIONS

WIPO, International search report and written opinions for PCT application CN2016075943 dated Jun. 15, 2016.
(Continued)

*Primary Examiner* — Joseph S Del Sole
*Assistant Examiner* — John Robitaille
(74) *Attorney, Agent, or Firm* — Houtteman Law LLC

(57) ABSTRACT

An additive manufacturing device utilizing an electron beam and laser integrated scanning comprises: a vacuum generating chamber (1); a worktable means having a forming region at least provided in the vacuum generating chamber (1); a powder supply means configured to supply a powder to the forming region; an electron-beam emission focusing and scanning means (6) and an laser-beam emission focusing and scanning means (7) configured in such a manner that a scanning range of the electron-beam emission focusing and scanning means (6) and a scanning range of the laser-beam emission focusing and scanning means (7) cover at least a part of the forming region; and a controller configured to control the electron-beam emission focusing and scanning (Continued)

means (6) and the laser-beam emission focusing and scanning means (7) to perform a powder integrated-scanning and forming treatment on the forming region.

12 Claims, 4 Drawing Sheets

(51) Int. Cl.

| | | |
|---|---|---|
| B28B 1/00 | (2006.01) | |
| B29C 64/371 | (2017.01) | |
| H01J 37/22 | (2006.01) | |
| B33Y 30/00 | (2015.01) | |
| B23K 26/082 | (2014.01) | |
| B23K 26/12 | (2014.01) | |
| B23K 26/342 | (2014.01) | |
| B23K 15/00 | (2006.01) | |
| B23K 26/046 | (2014.01) | |
| B28B 17/00 | (2006.01) | |
| B22F 10/30 | (2021.01) | |
| B33Y 50/02 | (2015.01) | |

(52) U.S. Cl.
CPC ........ *B23K 15/0086* (2013.01); *B23K 26/046* (2013.01); *B23K 26/082* (2015.10); *B23K 26/1224* (2015.10); *B23K 26/342* (2015.10); *B28B 1/00* (2013.01); *B28B 1/001* (2013.01); *B28B 17/0081* (2013.01); *B29C 64/153* (2017.08); *B29C 64/371* (2017.08); *B33Y 30/00* (2014.12); *H01J 37/228* (2013.01); *B22F 10/30* (2021.01); *B22F 2999/00* (2013.01); *B33Y 50/02* (2014.12); *H01J 2237/30483* (2013.01); *Y02P 10/25* (2015.11)

(56) References Cited

U.S. PATENT DOCUMENTS

| | | | |
|---|---|---|---|
| 2012/0217226 A1 | 8/2012 | Bayer | |
| 2014/0348692 A1* | 11/2014 | Bessac | .................. B29C 64/153 419/53 |

FOREIGN PATENT DOCUMENTS

| | | |
|---|---|---|
| CN | 104001915 A | 8/2014 |
| CN | 104010749 A | 8/2014 |
| CN | 104136149 A | 11/2014 |
| CN | 104190931 A | 12/2014 |
| CN | 104759623 A | 7/2015 |
| DE | 102007056984 A1 | 5/2009 |
| DE | 102009051551 A1 | 5/2011 |
| RU | 2539135 C2 | 1/2015 |
| WO | 2013080030 A1 | 6/2013 |

OTHER PUBLICATIONS

WIPO, International Search Report dated Jun. 15, 2016.
China Patent Office, Office action dated May 23, 2016 for CN application 201510104702.9, which is a China counterpart application of the present US patent application.
China Patent Office, Office action dated Nov. 16, 2016 for CN application 201510104702.9, , which is a China counterpart application of the present US patent application.
European Patent Office, Office action dated Oct. 2, 2018 for EP application 16761103, which is an European counterpart application of the present application.

* cited by examiner

ADDITIVE MANUFACTURING DEVICE UTILIZING EB-LASER COMPOSITE SCAN

CROSS-REFERENCE TO RELATED APPLICATIONS

The present application is a national phase entry under 35 USC § 371 of International Application PCT/CN2016/075943, filed Mar. 9, 2016, which claims the benefit of and priority to Chinese Patent Application No. 201510104702.9, filed Mar. 10, 2015, the entire disclosures of which are incorporated herein by reference.

FIELD

The present disclosure relates to an additive manufacturing device for three-dimensional parts, which heats materials utilizing an electron beam and laser integrated scanning to sinter the materials or to melt and deposit the materials layer by layer, and has good performance, high efficiency, high precision, and high material adaptability.

BACKGROUND

Additive manufacture of parts, also called as rapid forming or three-dimensional printing, has great advantages in formations of complicatedly structured parts and special materials. A high-power electron beam or a high-power laser beam is generally adopted as a heat source in this process to sinter or melt the materials layer by layer, so as to stack and shape the materials layer by layer. Typical processes include selective laser sintering (SLS), selective laser melting (SLM) and electron beam selective melting (EBSM). Patent US 20140348692A1 discloses an apparatus and a process for performing additive manufacturing integrally by electron beam and laser. According to the process disclosed by US 20140348692A1, both the laser-beam emission means and the electron-beam emission means are disposed inside the vacuum chamber without vapor deposition preventer. As intense evaporation exists when the laser or the electron beam scans to preheat or melt the powder in the vacuum space, the reflecting mirror and lens in the laser path will be easily plated or coated, which could block off the laser path and cause an interruption of the process.

SUMMARY

The applicant of the present disclosure finds that a product of a selective sintering/melting technology based on laser exhibits high precision, good surface roughness, but also shows lower forming efficiency as well as lower plasticity and low ductility. In addition, as the materials have a lower absorption rate for laser energy, the forming region has a low temperature (about 200° C.), thereby causing a high thermal stress, an easy deformation and a thermal stress accumulation of a work piece in a forming process. Thus, it is difficult to apply the selective sintering/melting technology based on laser to the additive manufacture of brittle materials.

In terms of the selective melting technology based on electron beam, as the materials have a high absorption rate for electron beam energy, the temperature of the forming region can be kept in a high level (up to 800° C.-900° C.), which ensures that the thermal stress of the work piece in the forming process is in a low level and hence can control the deformation and the thermal stress accumulation of the work piece effectively. The plasticity and ductility of the product is high, so that the selective melting technology based on electron beam is relatively suitable for the additive manufacture of brittle materials. In addition, the forming efficiency is high and three to four times that of the selective laser melting (SLM). However, the product has a worse surface roughness, and a powder smoking phenomenon occurring due to a low electrical conductivity of the powder exists, which in serious case may influence a smooth proceeding of the process.

The present disclosure aims to solve one of the technical problems in the related art to at least some extent.

Accordingly, one objective of the present disclosure aims to provide an additive manufacturing device, and the additive manufacturing device combines the electron beam with the laser beam to perform a selective melting based on an integrated scanning.

The additive manufacturing device utilizing an electron beam and laser integrated scanning according to embodiments of the present disclosure includes: a vacuum generating chamber; a worktable means having a forming region provided in the vacuum generating chamber; a powder supply means configured to supply a powder to the forming region; at least one electron-beam emission focusing and scanning means and at least one laser-beam emission focusing and scanning means, the laser-beam emission focusing and scanning means being disposed outside the vacuum generating chamber and configured to emit a laser beam into the vacuum generating chamber, the electron-beam emission focusing and scanning means and the laser-beam emission focusing and scanning means being configured in such a manner that a scanning range of the electron-beam emission focusing and scanning means and a scanning range of the laser-beam emission focusing and scanning means cover at least a part of the forming region; and a controller configured to control the electron-beam emission focusing and scanning means and the laser-beam emission focusing and scanning means to perform a powder integrated-scanning and forming treatment on the forming region.

The additive manufacturing device utilizing the electron beam and laser integrated scanning according to embodiments of the present disclosure combines the electron beam with the laser beam to perform the integrated scanning and the selective melting, so that advantages of the electron beam selective melting and the laser selective melting are combined.

In addition, the additive manufacturing device utilizing the electron beam and laser integrated scanning according to embodiments of the present disclosure may also have additional technical features as follow.

According to an example of the present disclosure, the scanning range of the electron-beam emission focusing and scanning means and the scanning range of the laser-beam emission focusing and scanning means cover the whole forming region.

According to an example of the present disclosure, the powder integrated-scanning and forming treatment includes at least one treatment of scanning, heating, sintering and melting the powder via an electron beam emitted by the electron-beam emission focusing and scanning means and a laser beam emitted by the laser-beam emission focusing and scanning means.

According to an example of the present disclosure, the controller is configured to control the electron beam emitted by the electron-beam emission focusing and scanning means and the laser beam emitted by the laser-beam emission focusing and scanning means to simultaneously or alternatively perform the powder integrated-scanning and forming treatment on the powder in a same area or different areas in the forming region.

According to an example of the present disclosure, the controller is configured to control the laser beam emitted by the laser-beam emission focusing and scanning means to form a required section contour in the forming region; and the controller is configured to control the electron beam emitted by the electron-beam emission focusing and scanning means to scan the powder in the section contour, melt and deposit the powder so as to form a required section.

According to an example of the present disclosure, the electron-beam emission focusing and scanning means and the laser-beam emission focusing and scanning means are provided at a top of the vacuum generating chamber.

According to an example of the present disclosure, the electron-beam emission focusing and scanning means and the laser-beam emission focusing and scanning means are configured to be shifted in position relative to the worktable means so as to enlarge the scanning range.

According to an example of the present disclosure, the worktable means is configured to be shifted in position in the vacuum generating chamber so as to enlarge the scanning range of the electron-beam emission focusing and scanning means and the scanning range of the laser-beam emission focusing and scanning means.

According to an example of the present disclosure, the additive manufacturing device includes two electron-beam emission focusing and scanning means and one laser-beam emission focusing and scanning means, and the laser-beam emission focusing and scanning means is disposed between the two electron-beam emission focusing and scanning means.

According to an example of the present disclosure, the additive manufacturing device includes four electron-beam emission focusing and scanning means and one laser-beam emission focusing and scanning means, and the electron-beam emission focusing and scanning means are arranged around the laser-beam emission focusing and scanning means.

According to an example of the present disclosure, the powder includes a ceramic powder and/or a metal powder.

According to an example of the present disclosure, the worktable means includes: an operation platform, the forming region being disposed on the operation platform; a piston-type forming cylinder means provided below the operation platform and including a forming cylinder and a piston-type elevating member, an upper edge of the forming cylinder being flush with the operation platform, and the piston-type elevating member being configured to rise and fall in the forming cylinder.

According to an example of the present disclosure, the powder supply means includes: a powder feeder configured to supply the powder to an upper surface of the operation platform; and a powder laying unit provided on the operation platform and configured to push the powder into the forming cylinder and lay the powder flat therein.

According to an example of the present disclosure, the electron-beam emission focusing and scanning means includes: a casing provided outside the vacuum generating chamber; a filament configured to produce an electron beam and provided in the casing; a cathode provided in the casing and located below the filament; a grid electrode provided in the casing and located below the cathode; an anode provided in the casing and located below the grid electrode; a focusing coil provided in the casing and located below the anode; and a deflection coil provided in the casing and located below the focusing coil.

According to an example of the present disclosure, the laser-beam emission focusing and scanning means includes a laser source configured to produce a laser beam and a focusing and scanning unit connected with the laser source, and the focusing and scanning unit is connected with the vacuum generating chamber.

Additional aspects and advantages of embodiments of present disclosure will be given in part in the following descriptions, become apparent in part from the following descriptions, or be learned from the practice of the embodiments of the present disclosure.

DETAILED DESCRIPTION

Figure 1:
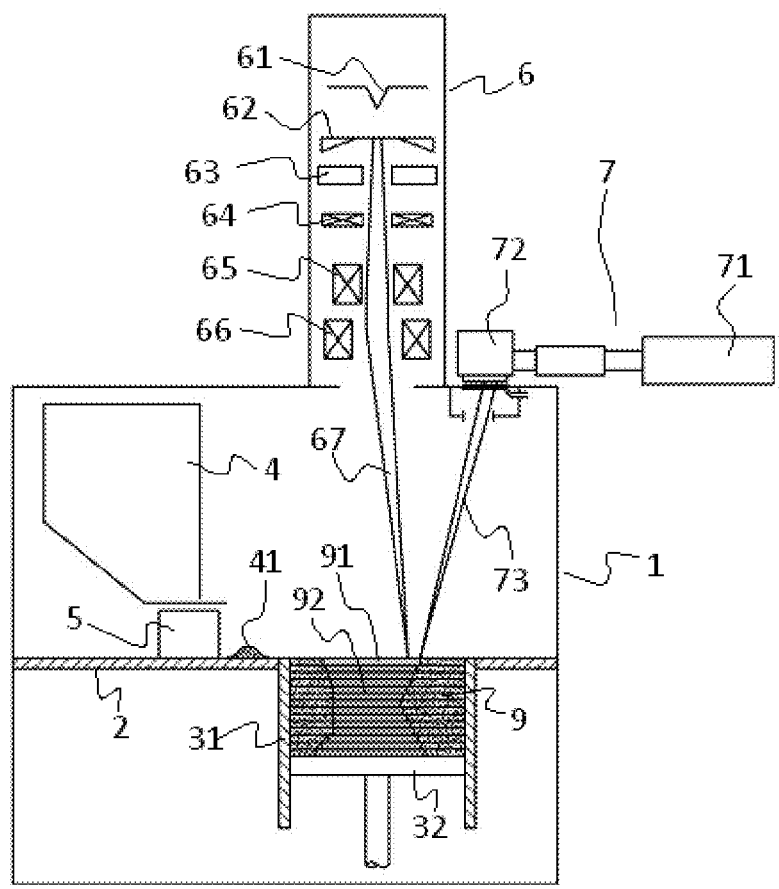
FIG. 1 is a schematic view of an additive manufacturing device utilizing an electron beam and laser integrated scanning according to an embodiment of the present disclosure.

Embodiments of the present disclosure are described in detail in the following. The examples of the embodiments are shown in the accompanying drawings. The same or similar elements and the elements having same or similar functions are denoted by like reference numerals throughout the descriptions. The embodiments described herein with reference to drawings are explanatory, illustrative, and used to generally understand the present disclosure. The embodiments shall not be construed to limit the present disclosure.

An additive manufacturing device utilizing an electron beam and laser integrated scanning according to embodiments of the present disclosure will be described in detail in the following with reference to the accompanying drawings.

As illustrated in FIG. 1 to FIG. 5, the additive manufacturing device utilizing the electron beam and laser integrated scanning according to embodiments of the present disclosure includes a vacuum generating chamber 1, a worktable means, a powder supply means, at least one electron-beam emission focusing and scanning means 6, at least one laser-beam emission focusing and scanning means 7 and a controller (not shown).

Specifically, a forming region of the worktable means at least is provided in the vacuum generating chamber 1.

According to an embodiment of the present disclosure, the worktable means includes an operation platform 2 and a piston-type forming cylinder means. The forming region is arranged on the operation platform 2. The piston-type forming cylinder means is disposed below the operation platform 2 and includes a forming cylinder 31 and a piston-type elevating member 32. An upper edge of the forming cylinder 31 is flush with the operation platform 2, and the piston-type elevating member 32 is configured to rise and fall in the forming cylinder 31.

The powder supply means is configured to supply a powder to the forming region. According to an embodiment of the present disclosure, the powder includes at least one of a ceramic powder and a metal powder. However, it should be noted that a suitable material can be selected for the powder according to requirements of a part needing the additive manufacture and such material also falls into a protection scope of the present disclosure.

According to an embodiment of the present disclosure, the powder supply means may include a powder feeder 4 and a powder laying unit 5. As illustrated in FIG. 1, the powder feeder 4 supplies the powder to an upper surface of the operation platform 2. The powder laying unit 5 is provided on the operation platform 2 and configured to push the powder into the forming cylinder 31 and lay the powder flat therein.

The electron-beam emission focusing and scanning means 6 and the laser-beam emission focusing and scanning means 7 are configured in such a manner that scanning ranges of the electron-beam emission focusing and scanning means 6 and the laser-beam emission focusing and scanning means 7 cover at least a part of the forming region. As illustrated in FIG. 1, from top to bottom, the electron-beam emission focusing and scanning means 6 includes a filament 61, a cathode 62, a grid electrode 63, an anode 64, a focusing coil 65 and a scanning deflection coil 66 having a deflection winding in x direction and a deflection winding in y direction. Each electron-beam emission focusing and scanning means 6 can emit an electron beam and perform a single-beam scanning or a multi-beams scanning. Each electron beam has an enough power to heat, sinter and melt a forming material.

According to an embodiment of the present disclosure, as illustrated in FIG. 1, the laser-beam emission focusing and scanning means 7 includes a laser source 71 and a focusing and scanning unit 72 having a function of a light-beam focusing, scanning and deflection galvanometer. Each laser-beam emission focusing and scanning means 7 can emit a laser beam and perform a single-beam scanning or a multi-beams scanning. Each laser beam has an enough power to heat, sinter and melt the forming material.

Advantageously, the scanning ranges of the electron-beam emission focusing and scanning means 6 and the laser-beam emission focusing and scanning means 7 can cover the whole forming region.

The controller controls the electron-beam emission focusing and scanning means 6 and the laser-beam emission focusing and scanning means 7 to perform a powder integrated-scanning and forming treatment on the forming region. According to an embodiment of the present disclosure, the powder integrated-scanning and forming treatment includes at least one treatment of scanning, heating, sintering and melting the powder in the forming region via the electron beam emitted by the electron-beam emission focusing and scanning means 6 and the laser beam emitted by the laser-beam emission focusing and scanning means 7. In addition, the scanning, heating, sintering and melting herein should be understood broadly in terms of a material processing field. For example, the heating may include continuous or intermittent pre-heating, warming or the like.

In the additive manufacturing device utilizing the electron beam and laser integrated scanning according to embodiments of the present disclosure, the electron beam and the laser beam are combined to carry out an integrated scanning so as to perform a selective melting, and thus advantages of an electron beam selective melting and a selective laser melting are combined. Specifically, both the scanning electron beam emitted by the electron-beam emission focusing and scanning means and the scanning laser beam emitted by the laser-beam emission focusing and scanning means can be used to scan the forming region, pre-heat the powder and control a temperature-fall process, thereby enabling a temperature field of the forming region to be in a suitable range, controlling a temperature gradient and reducing a thermal stress, and also can be used to scan a section of a part and inner and outer contours of the section, thereby gradually warming up, sintering and melting the materials in the section to form a clear, continuous and complete section and contours of the section, thus obtaining the part having a high performance and a high precision.

According to an example of the present disclosure, the controller controls the electron beam emitted by the electron-beam emission focusing and scanning means 6 and the laser beam emitted by the laser-beam emission focusing and scanning means 7 to simultaneously or alternatively perform the powder integrated-scanning and forming treatment on the powder in a same area or different areas in the forming region.

For example, the controller controls the laser beam emitted by the laser-beam emission focusing and scanning means 7 to scan the inner and outer contours of the section of the part, so as to obtain clear and complete contour boundaries. The controller controls the electron beam emitted by the electron-beam emission focusing and scanning means 6 to scan an inner area of the section of the part, so as to melt the powder completely and hence deposit the section of the part.

Further, the controller controls the laser beam emitted by the laser-beam emission focusing and scanning means 7 to pre-heat the powder in the forming region, so as to slightly sinter the powder to a certain degree, thereby improving an electrical conductivity and reducing a probability of powder smoking.

It should be noted herein that when the electron beam emitted by the electron-beam emission focusing and scanning means 6 is exerted on the powder directly, as powder particles all carry electrons, a powder smoking phenomenon occurs to the powder particles carrying electrons according to a principle of "like charges repel, but opposite ones attract". The laser beam emitted by the laser-beam emission focusing and scanning means 7 can pre-heat the powder in the forming region and slightly sinter the powder to a certain degree, thus reducing the probability of powder smoking.

Figure 3:
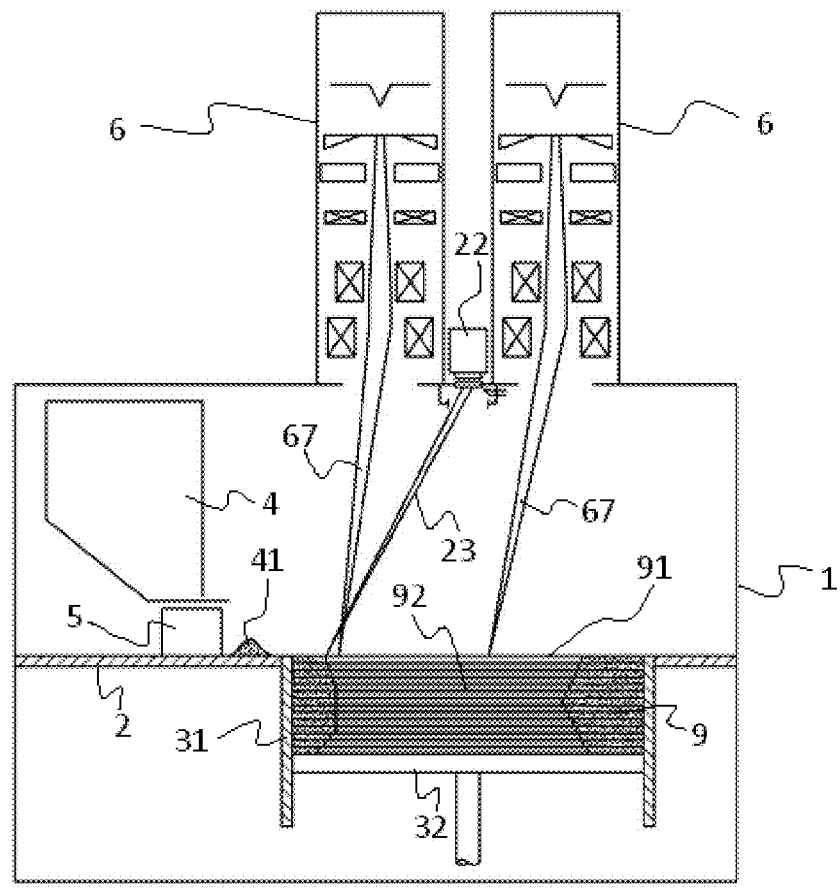
FIG. 3 is a schematic view of an additive manufacturing device utilizing an electron beam and laser integrated scanning according to another embodiment of the present disclosure.

As illustrated in FIG. 1 and FIG. 3, according to an example of the present disclosure, the electron-beam emission focusing and scanning means 6 and the laser-beam emission focusing and scanning means 7 are provided at a top of the vacuum generating chamber 1.

Advantageously, the electron-beam emission focusing and scanning means 6 and the laser-beam emission focusing and scanning means 7 can be shifted in position relative to the worktable means so as to enlarge the scanning ranges thereof. Further, the worktable means can be shifted in position in the vacuum generating chamber 1, so as to enlarge the scanning ranges of the electron-beam emission focusing and scanning means and the laser-beam emission focusing and scanning means.

As illustrated in FIG. 3, according to an example of the present disclosure, the additive manufacturing device includes two electron-beam emission focusing and scanning means 6 and one laser-beam emission focusing and scanning means 7. The laser-beam emission focusing and scanning means 7 is disposed between the two electron-beam emission focusing and scanning means 6.

Figure 4:
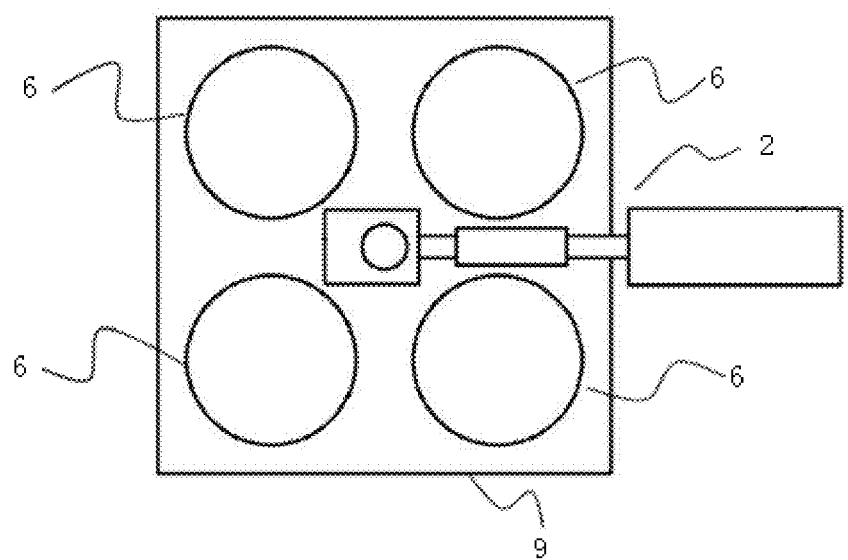
FIG. 4 is a schematic view of an additive manufacturing device utilizing an electron beam and laser integrated scanning according to another embodiment of the present disclosure.

As illustrated in FIG. 4, according to an example of the present disclosure, the additive manufacturing device includes four electron-beam emission focusing and scanning means 6 and one laser-beam emission focusing and scanning means 7. The electron-beam emission focusing and scanning means 6 are arranged around the laser-beam emission focusing and scanning means 7.

According to an example of the present disclosure, the electron-beam emission focusing and scanning means 6 includes a casing 60, a filament 61, a cathode 62, a grid electrode 63, an anode 64, a focusing coil 65 and a deflection coil 66. The casing 60 is disposed outside the vacuum generating chamber 1. The filament 61 is disposed in the casing 60 and configured to produce the electron beam. The cathode 62 is provided in the casing 60 and located below the filament 61. The grid electrode 63 is provided in the casing 60 and located below the cathode 62. The anode 64 is provided in the casing 60 and located below the grid electrode 63. The focusing coil 65 is provided in the casing 60 and located below the anode 64. The deflection coil 66 is provided in the casing 60 and located below the focusing coil 65.

In the above additive manufacturing device utilizing the electron beam and laser integrated scanning, advantages of the electron beam selective melting and the selective laser melting are combined, so that the additive manufacturing technology by means of the selective melting is realized with high performance, high efficiency, high precision and high material adaptability.

In a vacuum condition, one or a plurality of electron-beam emission focusing and scanning means 6 and one or a plurality of laser-beam emission focusing and scanning means 7 perform the integrated scanning. For example, FIG. 1 illustrates an embodiment where one electron-beam emission focusing and scanning means 6 and one laser-beam emission focusing and scanning means 7 perform the integrated scanning, FIG. 3 illustrates an embodiment where two electron-beam emission focusing and scanning means 6 and one laser-beam emission focusing and scanning means 7 perform the integrated scanning, and FIG. 4 illustrates an embodiment where four electron-beam emission focusing and scanning means 6 and one laser-beam emission focusing and scanning means 7 perform the integrated scanning. It should be noted that the one or the plurality of electron-beam emission focusing and scanning means 6 and the one or the plurality of laser-beam emission focusing and scanning means 7 both can cover the whole powder forming region.

Both the scanning electron beam emitted by the electron-beam emission focusing and scanning means 6 and the scanning laser beam emitted by the laser-beam emission focusing and scanning means 7 can be used to scan the forming region, pre-heat the powder and control the temperature-fall process, thereby enabling the temperature field of the forming region to be in the suitable range, controlling the temperature gradient and reducing the thermal stress, and also can be used to scan the section of the part and the inner and outer contours of the section, thereby gradually warming up, sintering and melting the materials in the section to form the clear, continuous and complete section and contours of the section, thus obtaining the part having the high performance and the high precision.

The electron beam emitted by the electron-beam emission focusing and scanning means 6 and the laser beam emitted by the laser-beam emission focusing and scanning means 7 can scan a same area or different areas simultaneously, or can scan a same area or different areas alternatively.

Figure 2:
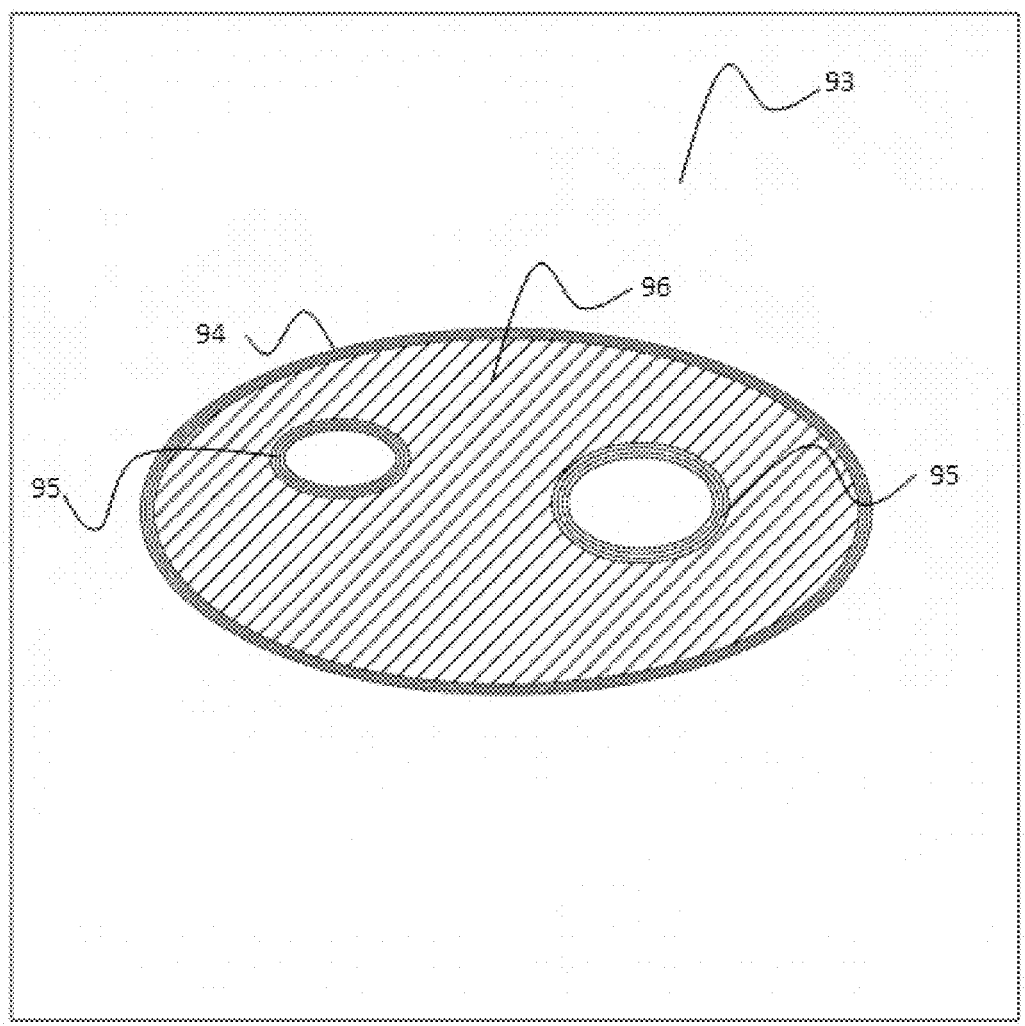
FIG. 2 is a schematic view of scanning areas of an electron beam and a laser beam of the device illustrated in FIG. 1.

As illustrated in FIG. 2, the laser beam is firstly utilized to scan and pre-heat the powder, so as to slightly sinter the powder to a certain degree, thereby improving the electrical conductivity and reducing the probability of powder smoking. Then, the electron beam is utilized to scan to increase the temperature of the powder to a suitable range rapidly. Subsequently, the laser beam is utilized to scan the inner and outer contours of the section of the part so as to obtain the clear and complete contour boundaries. Then, the electron beam is utilized to scan and fill the inner area of the section of the part, completely melt the powder and deposit the section of the part. Finally, the electron beam or the laser beam is utilized to scan so as to keep a gradual fall of the temperature of the forming region as required, avoid an increase of the thermal stress and a generation of a thermal deformation, and control a final microstructure of the part.

For a large forming region, it is possible to arrange a plurality of electron-beam emission focusing and scanning means 6 and one or a plurality of laser-beam emission focusing and scanning means 7 at the top of the vacuum chamber. Scanning areas of the plurality of electron-beam emission focusing and scanning means 6 are combined into a large integrated scanning area, and the scanning areas of the respective electron-beam emission focusing and scanning means 6 are not allowed to have a gap therebetween, but should have a partial overlap or lap joint, so as to avoid that there is a portion in the forming region which cannot be scanned and hence influences a manufacturing process. Scanning areas of the plurality of laser-beam emission focusing and scanning means 7 are combined into a large integrated scanning area, and the scanning areas of the respective laser-beam emission focusing and scanning means 7 are not allowed to have a gap therebetween, but should have a partial overlap or lap joint, so as to avoid that there is a portion in the forming region which cannot be scanned.

As illustrated in FIG. 4, the four electron-beam emission focusing and scanning means 6 are juxtaposed, and the scanning areas of the four electron-beam emission focusing and scanning means 6 together constitute a large integrated scanning area. As a scanning and deflection angle of the laser-beam emission focusing and scanning means 7 is large, the scanning range of the laser-beam emission focusing and scanning means 7 can cover a large area, so it is possible to scan the integrated area constituted by the scanning areas of the four electron-beam emission focusing and scanning means 6 just by arranging one laser-beam emission focusing and scanning means 7 in middle of the four electron-beam emission focusing and scanning means 6, thus realizing the electron beam and laser beam integrated scan.

For a further larger forming region, at least one electron-beam emission focusing and scanning means 6 and at least one laser-beam emission focusing and scanning means 7 may be provided at the top of the vacuum generating chamber 1 and shifted in position relative to the operation platform 2, so as to enlarge the scanning ranges thereof. Optionally, for the further larger forming region, the scanning ranges of the electron-beam emission focusing and scanning means and the laser-beam emission focusing and scanning means can be enlarged through position shifts of the forming cylinder 31 and the operation platform 2 in the vacuum generating chamber.

The additive manufacturing device utilizing the electron beam and laser integrated scanning according to embodiments of the present disclosure can perform the selective forming for different materials and also the selective forming for gradient materials, for example, the forming of the ceramic powder through the laser beam scanning, and the forming of the metal powder through the electron beam or laser beam scanning.

The specific embodiments disclosed in FIGS. 1, 3 and 4 will be illustrated simply in the following.

Embodiment One

As illustrated in FIG. 1, the additive manufacturing device utilizing the electron beam and laser integrated scanning according to an embodiment of the present disclosure includes a vacuum generating chamber 1, an operation platform 2, a forming cylinder 31, a piston-type elevating member 32, a powder feeder 4, a powder laying unit 5, an electron-beam emission focusing and scanning means 6, a laser-beam emission focusing and scanning means 7 and a controlling computer serving as a controller.

The electron-beam emission focusing and scanning means 6 includes a filament 61 configured to produce an electron beam 67, a cathode 62, a grid electrode 63, an anode 64, a focusing coil 65 and a deflection coil 66. The produced electron beam 67 is configured to scan the forming region, and heat, sinter and melt the powder.

The laser-beam emission focusing and scanning means 7 includes a laser source 71 configured to produce a laser beam 73 and a focusing and scanning unit 72 connected with the laser source 71. The produced laser beam 73 is configured to scan the forming region so as to heat, sinter and melt the powder.

The vacuum generating chamber 1 provides a vacuum environment for a selective melting process, and the operation platform 2 is horizontally disposed in middle of the vacuum generating chamber 1.

The powder feeder 4 is disposed above the operation platform 2 and configured to store a power 41 and supply the powder 41 on ration.

The powder laying unit 5 is configured to perform a reciprocating movement on the operation platform 2, so as to push the powder to the forming region and lay the powder flat on the forming region.

The forming cylinder 31 is disposed below the operation platform 2, and the piston-type elevating member 32 is provided in the forming cylinder 31. An accommodating cavity having a changeable height defined by the piston-type elevating member 32 and the forming cylinder 31 contains a powder bed 9 and a formed part 92 therein.

A process of the additive manufacturing device utilizing the electron beam and laser integrated scanning according to an embodiment of the present disclosure is illustrated as follow. When a previous deposited layer is formed completely and a new deposited layer begins to form, the piston-type elevating member 32 falls with respect to the operation platform 2 by a height equal to a thickness of a powder layer, so that a height difference which is equal to the thickness of the powder layer is provided between an upper surface of the powder bed 9 and a surface of the operation platform 2. Under a control of the controlling computer, a certain amount of the forming material powder 41 is output by the powder feeder 4 and falls on the surface of the operation platform 2. Subsequently, the powder laying unit 5 pushes the powder 41 into the forming cylinder 31 and lays the powder 41 flat on the powder bed 9 to form a new powder layer.

The laser-beam emission focusing and scanning means 7 and the electron-beam emission focusing and scanning means 6 perform the integrated scanning on the new powder layer, pre-heat the powder in the forming region, sinter and melt the powder in the section of the part, and deposit a new deposited layer 91 on the upper surface of the part 92.

As repeated in such a manner, a new deposited layer is stacked on the part 92 successively and layer by layer until a final shape of the part 92 is obtained, and thus the additive manufacturing process of the part is finished.

In the above process, the integrated scanning performed by the laser-beam emission focusing and scanning means 7 and the electron-beam emission focusing and scanning means 6 on the powder means that the electron beam 67 emitted by the electron-beam emission focusing and scanning means 6 and the laser beam 73 emitted by the laser-beam emission focusing and scanning means 7 scan a same area or different areas simultaneously or alternatively, so as to perform a pre-heating, a selective sintering and a selective melting on the powder bed 9.

An implementation manner of the integrated scanning is illustrated in FIG. 2. The laser-beam emission focusing and scanning means 7 is firstly utilized to scan the forming region 93 to pre-heat the powder, so as to slightly sinter the powder to a certain degree, thereby improving the electrical conductivity and reducing the probability of powder smoking.

Then, the electron-beam emission focusing and scanning means 6 is utilized to scan the forming region 93 to increase the temperature of the powder rapidly.

Subsequently, the laser-beam emission focusing and scanning means 7 is utilized to scan an outer contour 94 and an inner contour 95 of the section of the part so as to obtain clear and complete contour boundaries.

Then, the electron-beam emission focusing and scanning means 6 is utilized to scan an inner area 96 of the section of the part, completely melt the powder and deposit the new deposited layer 91.

Finally, the electron-beam emission focusing and scanning means 6 or the laser-beam emission focusing and scanning means 7 is utilized to scan the forming region 93 or the contours 94, 95 as well as the inner area 96 of the section of the part so as to keep a gradual fall of the temperature of the forming region as required, avoid an increase of the thermal stress and a generation of a thermal deformation, and control a final microstructure of the part.

Embodiment Two

FIG. 3 and FIG. 4 illustrate an additive manufacturing device utilizing the electron beam and laser integrated scanning according to another embodiment of the present disclosure, which includes a plurality of electron-beam emission focusing and scanning means 6 and one laser-beam emission focusing and scanning means 7, so as to perform the integrated scanning. Other configurations and process are similar to those of embodiment one, which will not be elaborated here.

The laser-beam emission focusing and scanning means 7 has a large scanning area and can cover the integrated scanning area constituted by the scanning areas of the plurality of electron-beam emission focusing and scanning means 6, so the one laser-beam emission focusing and scanning means 7 is generally arranged in middle of the plurality of electron-beam emission focusing and scanning means 6.

FIG. 3 illustrates a condition where two electron-beam emission focusing and scanning means 6 and one laser-beam emission focusing and scanning means 7 are combined. In this case, the one laser-beam emission focusing and scanning means 7 is arranged between the two electron-beam emission focusing and scanning means 6.

Figure 5:
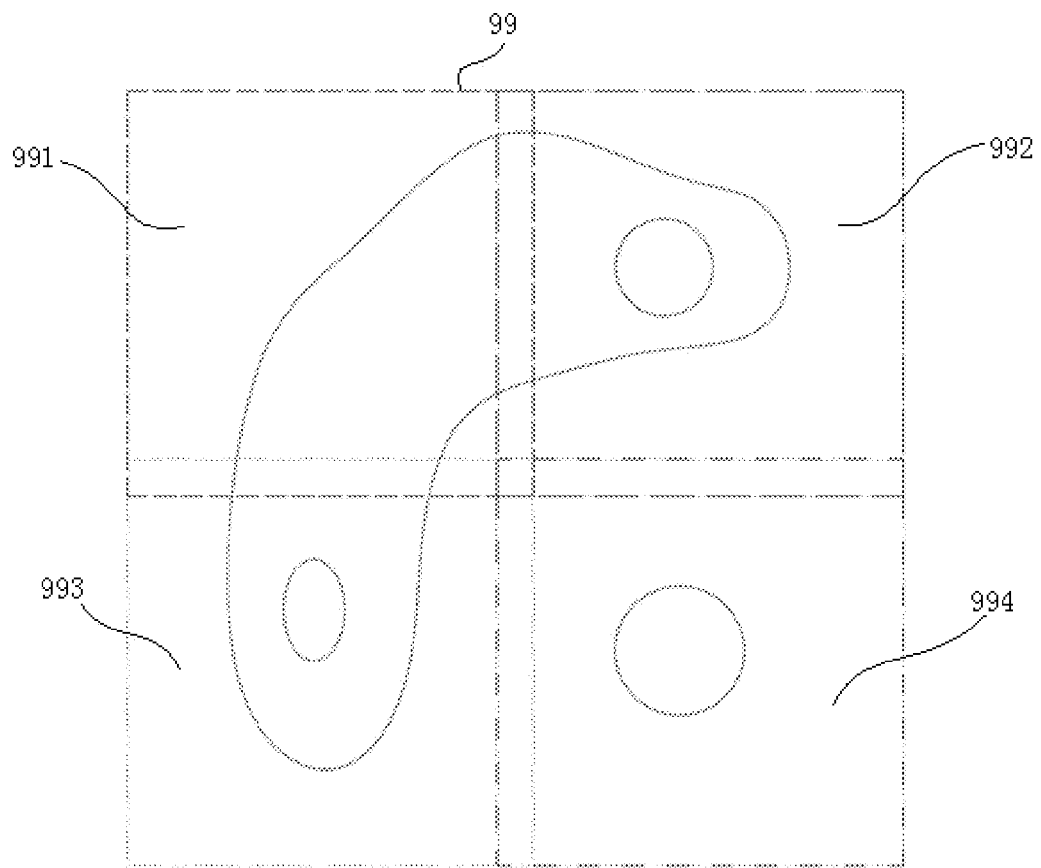
FIG. 5 is a schematic view of a scanning range and a target area of an electron-beam emission focusing and scanning means 6 in FIG. 4.

FIG. 4 illustrates a condition where four electron-beam emission focusing and scanning means 6 and one laser-beam emission focusing and scanning means 7 are combined. In this case, the four electron-beam emission focusing and scanning means 6 are arranged around the one laser-beam emission focusing and scanning means 7. For example, the four electron-beam emission focusing and scanning means 6 are arranged in a 2×2 array. The scanning areas 991, 992, 993 and 994 of the electron-beam emission focusing and scanning means 6 are identical in size and combined into a large integrated scanning area 99 (as illustrated in FIG. 5). There is no gap existing between the scanning areas of the electron-beam emission focusing and scanning means 6 (for example, there is a partial overlap or lap joint therebetween), so as to avoid that there is a portion in the forming region which cannot be scanned. The laser-beam emission focusing and scanning means 7 is located in middle of the four electron-beam emission focusing and scanning means 6 and the scanning area of the laser-beam emission focusing and scanning means 7 covers the integrated scanning area 99 of the four electron-beam emission focusing and scanning means 6, thereby realizing the electron beam and laser integrated scanning. In addition, the four electron-beam emission focusing and scanning means 6 and the one laser-beam emission focusing and scanning means 7 may further be combined into an electron beam and laser integrated scanning unit, in which case a larger forming and scanning area can be obtained by means of a mechanical translational movement mechanism, so as to realize the additive manufacture of a three-dimensional part in a larger size.

Reference throughout this specification to "an embodiment," "some embodiments," "an example," "a specific example," or "some examples," means that a particular feature, structure, material, or characteristic described in connection with the embodiment or example is included in at least one embodiment or example of the present disclosure. Thus, the appearances of the phrases in various places throughout this specification are not necessarily referring to the same embodiment or example of the present disclosure. Furthermore, the particular features, structures, materials, or characteristics may be combined in any suitable manner in one or more embodiments or examples. In addition, in the absence of contradictory, the different embodiments or examples or features in the different embodiments and examples described in the present specification can be united or combined by those skilled in the art.

Although embodiments have been shown and described, it would be appreciated that the above embodiments are explanatory and cannot be construed to limit the present disclosure, and changes, alternatives, variation and modifications can be made in the embodiments by those skilled in the art without departing from the scope of the present disclosure.

What is claimed is:

1. An additive manufacturing device utilizing an electron beam and laser integrated scanning, comprising:
    a vacuum generating chamber;
    a worktable means having a forming region at least provided in the vacuum generating chamber;
    a powder supply means configured to supply a powder to the forming region, the powder supply means comprising a powder feeder configured to supply the powder to an upper surface of the operation platform; and a powder laying unit provided on the operation platform and configured to push the powder into a forming cylinder and lay the powder flat therein;
    at least one electron-beam emission focusing and scanning means and at least one laser-beam emission focusing and scanning means, the laser-beam emission focusing and scanning means being disposed outside the vacuum generating chamber and configured to emit a laser beam into the vacuum generating chamber, the electron-beam emission focusing and scanning means and the laser-beam emission focusing and scanning means being configured in such a manner that a scanning range of the electron-beam emission focusing and scanning means and a scanning range of the laser-beam emission focusing and scanning means cover at least a part of the forming region; and
    a controller configured to control the electron-beam emission focusing and scanning means and the laser-beam emission focusing and scanning means to perform a powder integrated-scanning and forming treatment on the forming region,
    wherein the electron-beam emission focusing and scanning means comprises a casing provided outside the vacuum generating chamber; a filament configured to produce an electron beam and provided in the casing; a cathode provided in the casing and located below the filament; a grid electrode provided in the casing and located below the cathode; an anode provided in the casing and located below the grid electrode; a focusing coil provided in the casing and located below the anode; and a deflection coil provided in the casing and located below the focusing coil,
    wherein the laser-beam emission focusing and scanning means comprises a laser source configured to produce the laser beam and a focusing and scanning unit connected with the laser source, and the focusing and scanning unit is connected with the vacuum generating chamber,
    wherein a scanning area of the electron-beam emission focusing and scanning means and a scanning area of the laser-beam emission focusing and scanning means at least partially overlap, the powder integrated-scanning and forming treatment comprises scanning, heating, sintering and melting the powder via an electron beam emitted by the electron-beam emission focusing and scanning means and scanning, heating, sintering and melting the powder via the laser beam emitted by the laser-beam emission focusing and scanning means, and the controller is configured to control the electron beam emitted by the electron-beam emission focusing and scanning means and the laser beam emitted by the laser-beam emission focusing and scanning means to simultaneously or alternatively perform the scanning on the powder in a same area or different areas in the forming region,
    wherein the focusing and scanning unit is protected from radiation produced in the vacuum forming chamber by means of a protection cover, and
    wherein the protection cover defines an opening for passage of the laser beam emitted by the laser-beam emission focusing and scanning means.

2. The additive manufacturing device according to claim 1, wherein the scanning range of the electron-beam emission focusing and scanning means and the scanning range of the laser-beam emission focusing and scanning means cover the whole forming region.

3. The additive manufacturing device according to claim 1, wherein the controller is configured to control the laser beam emitted by the laser-beam emission focusing and scanning means to form a required section contour in the forming region; and the controller is configured to control the electron beam emitted by the electron-beam emission focusing and scanning means to scan the powder in the section contour, melt and deposit the powder so as to form a required section.

4. The additive manufacturing device according to claim 1, wherein at least one of the electron-beam emission focusing and scanning means and the laser-beam emission focusing and scanning means is adjustable in position relative to the worktable means.

5. The additive manufacturing device according to claim 2, wherein at least one of the electron-beam emission focusing and scanning means and the laser-beam emission focusing and scanning means is adjustable in position relative to the worktable means.

6. The additive manufacturing device according to claim 1, wherein the worktable means is movable in the vacuum generating chamber so as to enlarge the scanning range of the electron-beam emission focusing and scanning means and the scanning range of the laser-beam emission focusing and scanning means.

7. The additive manufacturing device according to claim 1, wherein the additive manufacturing device comprises two electron-beam emission focusing and scanning means and one laser-beam emission focusing and scanning means, and the laser-beam emission focusing and scanning means is disposed between the two electron-beam emission focusing and scanning means.

8. The additive manufacturing device according to claim 1, wherein the additive manufacturing device comprises four electron-beam emission focusing and scanning means and one laser-beam emission focusing and scanning means, and the electron-beam emission focusing and scanning means are arranged around the laser-beam emission focusing and scanning means.

9. The additive manufacturing device according to claim 1, wherein the powder comprises at least one of a ceramic powder and a metal powder.

10. The additive manufacturing device according to claim 1, wherein the worktable means comprises:

an operation platform, the forming region being disposed on the operation platform;

a piston-type forming cylinder means provided below the operation platform and comprising the forming cylinder and a piston-type elevating member, an upper edge of the forming cylinder being flush with the operation platform, and the piston-type elevating member being configured to rise and fall in the forming cylinder.

11. The additive manufacturing device according to claim 1, wherein the additive manufacturing device comprises a nozzle inserted into the protection cover, and the nozzle is configured to inject inert gas into the protection cover.

12. An additive manufacturing device utilizing an electron beam and laser integrated scanning, comprising:

a vacuum generating chamber;

a worktable means having a forming region at least provided in the vacuum generating chamber;

a powder supply means configured to supply a powder to the forming region, the powder supply means comprising a powder feeder configured to supply the powder to an upper surface of the operation platform; and a powder laying unit provided on the operation platform and configured to push the powder into a forming cylinder and lay the powder flat therein;

at least one electron-beam emission focusing and scanning means and at least one laser-beam emission focusing and scanning means, the laser-beam emission focusing and scanning means being disposed outside the vacuum generating chamber and configured to emit a laser beam into the vacuum generating chamber, the electron-beam emission focusing and scanning means and the laser-beam emission focusing and scanning means being configured in such a manner that a scanning range of the electron-beam emission focusing and scanning means and a scanning range of the laser-beam emission focusing and scanning means cover at least a part of the forming region; and a controller configured to control the electron-beam emission focusing and scanning means and the laser-beam emission focusing and scanning means to perform a powder integrated-scanning and forming treatment on the forming region, wherein the electron-beam emission focusing and scanning means comprises a casing provided outside the vacuum generating chamber; a filament configured to produce an electron beam and provided in the casing; a cathode provided in the casing and located below the filament; a grid electrode provided in the casing and located below the cathode; an anode provided in the casing and located below the grid electrode; a focusing coil provided in the casing and located below the anode; and a deflection coil provided in the casing and located below the focusing coil, wherein the laser-beam emission focusing and scanning means comprises a laser source configured to produce the laser beam and a focusing and scanning unit connected with the laser source, and the focusing and scanning unit is connected with the vacuum generating chamber, wherein the focusing and scanning unit is protected from radiation produced in the vacuum forming chamber by means of a protection cover, and wherein the protection cover defines an opening for passage of the laser beam emitted by the laser-beam emission focusing and scanning means.

\* \* \* \* \*